United States Patent [19]

Hara et al.

[11] Patent Number: 5,323,440
[45] Date of Patent: Jun. 21, 1994

[54] X-RAY LITHOGRAPHY APPARATUS INCLUDING A DOSE DETECTABLE MASK

[75] Inventors: Shinichi Hara, Yokohama; Mitsuaki Amemiya, Atsugi; Shunichi Uzawa, Tokyo, all of Japan

[73] Assignee: Canon Kabushiki Kaisha, Tokyo, Japan

[21] Appl. No.: 22,407

[22] Filed: Feb. 24, 1993

Related U.S. Application Data

[63] Continuation of Ser. No. 701,801, May 17, 1991, abandoned.

[30] Foreign Application Priority Data

May 21, 1990 [JP] Japan .................... 2-129240

[51] Int. Cl.$^5$ .............................. G21K 5/00
[52] U.S. Cl. ........................ 378/34; 378/35; 378/97; 250/370.07; 250/492.2
[58] Field of Search ............ 378/34, 35, 87, 96, 378/108; 250/309, 327.2, 370.07, 338, 492.1, 492.2; 430/296; 346/108

[56] References Cited

U.S. PATENT DOCUMENTS

| | | | |
|---|---|---|---|
| 4,621,371 | 11/1986 | Gotou et al. | 378/34 |
| 4,777,641 | 10/1988 | Inagaki et al. | 378/34 |
| 4,785,187 | 11/1988 | Kariya et al. | 378/34 |
| 4,804,978 | 2/1989 | Tracy | 346/108 |
| 5,050,196 | 9/1991 | Kadosawa et al. | 378/34 |
| 5,112,724 | 5/1992 | Bradshaw | 430/296 |

FOREIGN PATENT DOCUMENTS 0283149 9/1988 European Pat. Off.
0359497 3/1990 European Pat. Off.

OTHER PUBLICATIONS

Johnson, et al., "Radiation Damage Effects in Boron Nitride Mask Membranes Subjected to X-Ray Exposures," J. Vac. Sci. Tech. B5(1), Jan. 1987, pp. 257 through 261.

*Primary Examiner*—David P. Porta
*Assistant Examiner*—Kim-Kwok Chu
*Attorney, Agent, or Firm*—Fitzpatrick, Cella, Harper & Scinto

[57] ABSTRACT

An X-ray exposure apparatus using radiation light as exposure light, wherein the apparatus includes: a display device; a detecting device for detecting in each exposure the amount of exposure absorbed by a mask during the exposure; a memory for memorizing an accumulated dose of the mask; and a controller for causing the display device to display a dose of the mask, wherein the dose to be displayed corresponds to the sum of the accumulated dose memorized in the memory and the amount of exposure detected by the detecting device. Also a mask structure suitably usable in such an exposure apparatus.

15 Claims, 5 Drawing Sheets

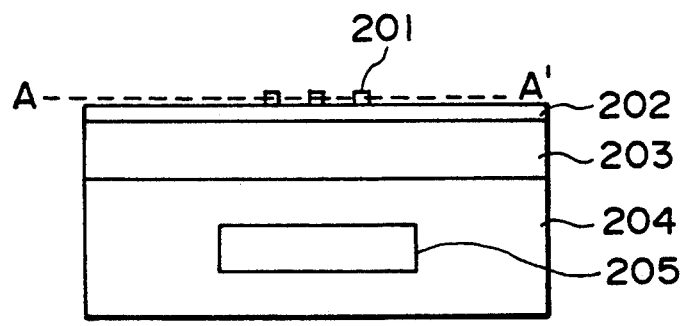
F I G. 2
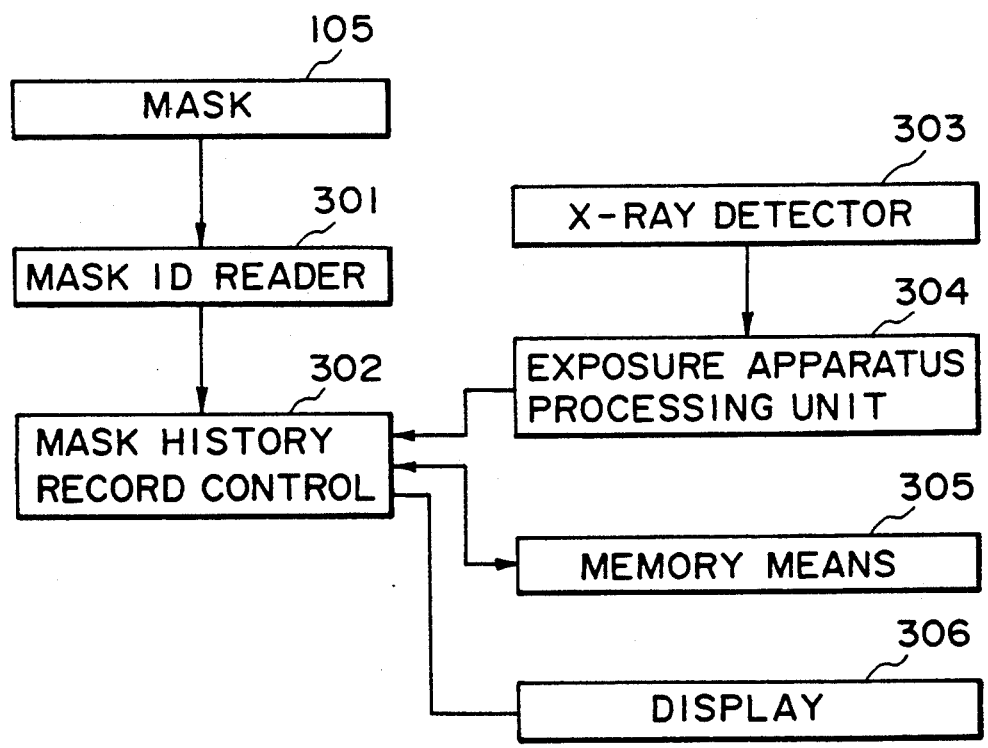
F I G. 3

X-RAY LITHOGRAPHY APPARATUS INCLUDING A DOSE DETECTABLE MASK

This application is a continuation of prior U.S. application Ser. No. 07/701,801 filed May 17, 1991, now abandoned.

FIELD OF THE INVENTION AND RELATED ART

This invention relates to an exposure apparatus for the manufacture of semiconductor devices such as ICs, LSIs, etc. More particularly, the invention is concerned with an X-ray exposure apparatus which uses radiation light as exposure light (printing light). In another aspect, the invention is concerned with a mask which is usable in such an X-ray exposure apparatus.

As for the exposure light source in the exposure apparatus, in many cases a light source which produces visible light or ultraviolet light is used. In the exposure process using such a light source, the possibility of damaging a mask is very small.

However, in the exposure process which uses synchrotron radiation light as a light source, having recently been proposed in an attempt to allow printing of very fine patterns, it has been reported that there is a possibility of a change in the characteristics of a mask ("Radiation Damage Effects in Boron Nitride Mask Membranes Subjected to X-ray Exposures" by W. A. Johnson, R. A. Levy, D. J. Resnick, T. E. Sanders, A. W. Yanof, H. Betz, H. Hunber and H. Oertel, "Journal of Vacuum Science & Technology", B. Vol. 5, No. 1, Jan/Feb 1987).

This generates a necessity of replacing an overexposed mask and, in order to properly determine the timing of replacement, it is necessary to accurately detect the dose of each mask. However, conventional exposure apparatuses are not equipped with such a function.

SUMMARY OF THE INVENTION

Since conventional exposure apparatuses are not equipped with the function of detecting the dose of each mask, there is a possibility that during exposure the dose of the mask goes beyond the limit of an allowable dose, resulting in failure of correct exposure. Since the manufacture of ICs, LSIs, etc. based on radiation light involves several tens of repetitions of an exposure process and the exposure time itself should be controlled very strictly, if correct exposure ends in failure, all the preceding exposure processes are wasted. This is a heavy loss.

It is accordingly a primary object of the present invention to provide an exposure apparatus with which the dose of each mask can be detected accurately.

It is another object of the present invention to provide a mask suitably usable in such an exposure apparatus.

In accordance with an aspect of the present invention, an X-ray exposure apparatus which uses radiation light as exposure light includes display means; detecting means for detecting in each exposure the amount of exposure absorbed by a mask during the exposure; storing means for memorizing an accumulated dose of the mask; and control means for causing said display means to display a dose of the mask, wherein the does to be displayed corresponds to the sum of the accumulated dose memorized in said storing means and the amount of exposure detected by said detecting means.

Each mask may be equipped with such a storing means. The control means may be arranged to compare the sum of the accumulated dose and the detected exposure amount, with a predetermined allowable dose and to cause the display means to display the result of the comparison.

Mask replacing means may be provided such that, when the control means discriminates an excess of the sum of the accumulated dose and the detected exposure amount beyond the predetermined allowable dose, the mask replacing means operates to replace the mask by another.

Since in an exposure of a mask, the exposure amount (dose) of the mask in that exposure is detected by the detecting means and the exposure amount converted into an accumulated dose memorized in the storing means is displayed in the display means, it is possible to obtain an accurate dose of each mask.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is an enlarged side view of a mask 105 in FIG. 1.

FIG. 3 is a block diagram showing the structure of an accumulated dose detecting means 108 in FIG. 1.

DESCRIPTION OF THE PREFERRED EMBODIMENTS

Figure 1:
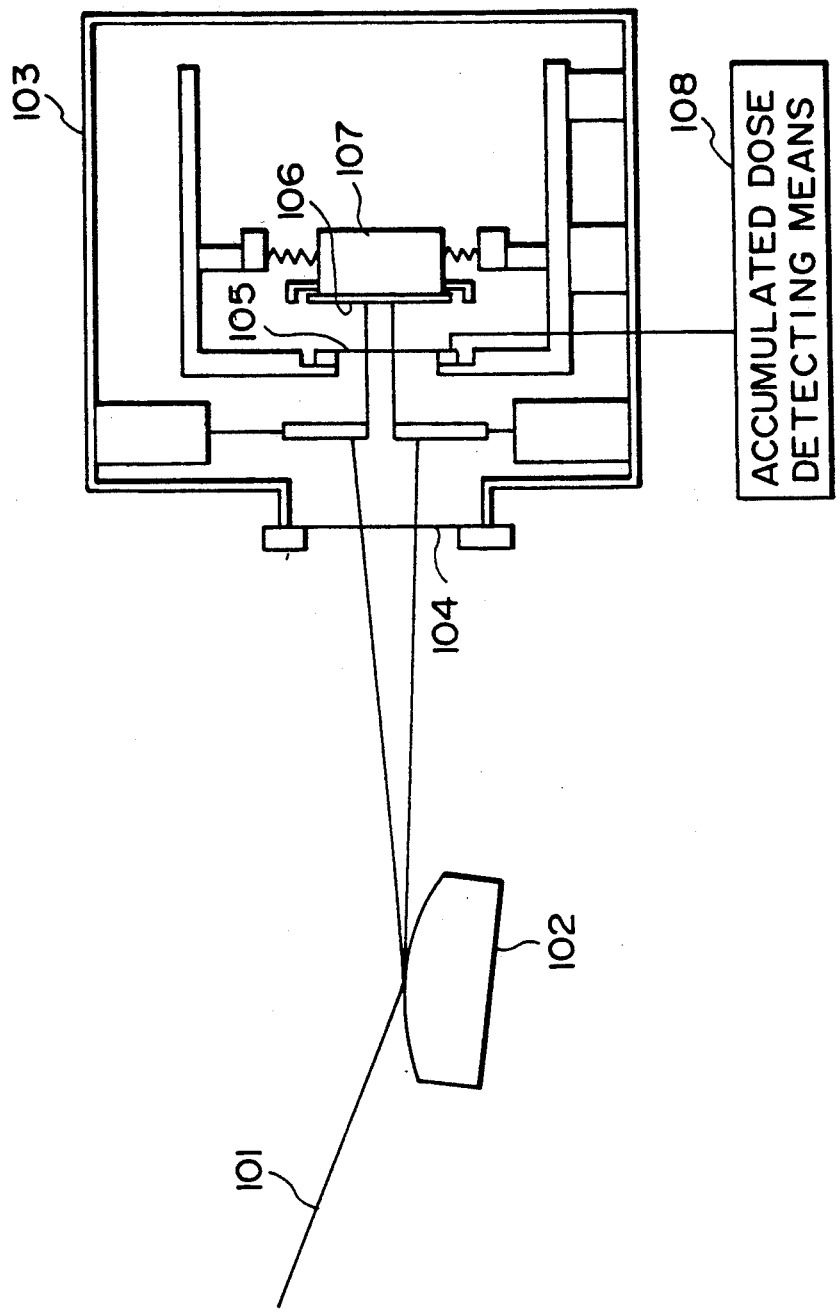
FIG. 1 is a sectional view schematically showing a general structure of a first embodiment of the present invention.

FIG. 1 is a sectional view showing a general structure of an X-ray exposure apparatus of the present invention.

Radiation light 101 emanates from a light source device such as a synchrotron, for example, and is diffracted and expanded by a mirror 102 having a large curvature radius. Then, it goes through a window 104 of an exposure chamber 103 and a mask 105, such that a wafer (semiconductor wafer) 106 placed on a wafer stage 107 is exposed. With this exposure, one of the processes for manufacture of semiconductor devices on the wafer 106 proceeds. Accumulated dose detecting means 108 is disposed adjacent to the circumferential portion of the mask 105 so as to detect the accumulated dose of the mask 105.

FIG. 2 is a side view of the mask 105 of FIG. 1.

Mask supporting film 202 is held by a mask supporting member 203, and a mask pattern provided by a mask absorbing material 201 is formed on the supporting film 202. The mask supporting member 203 is mounted onto a mask reinforcing member 204. The reinforcing member 204 has on its side a record of mask identification (mask ID) 205 representing an identification number of the mask 105, in the form of pattern information such as a bar code, for example.

Figure 4:
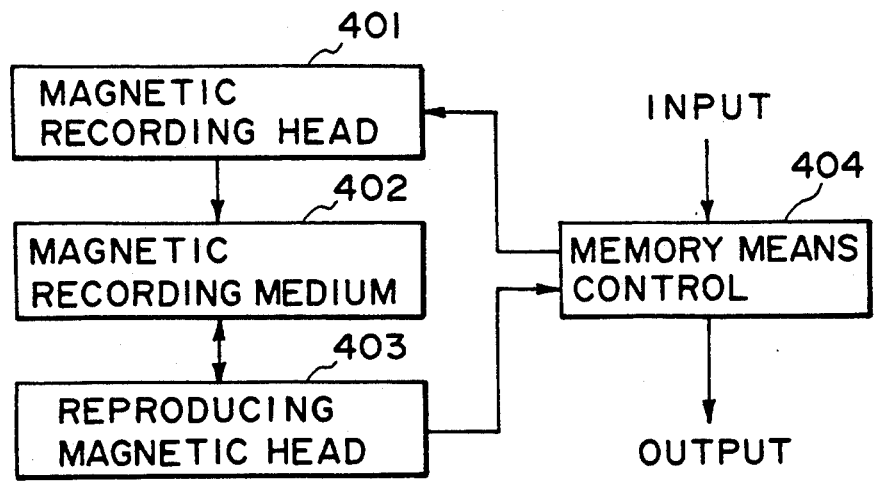
FIG. 4 is a block diagram showing the structure of a storing means 305 in FIG. 3.

FIG. 3 is a block diagram of the accumulated dose detecting means 108. FIG. 4 is a block diagram of a storing means 305 of FIG. 3.

The accumulated dose detecting means 108 comprises a mask ID reader 301 for reading the mask ID 205 recorded on the mask 105; an X-ray detector (detecting means) 303 for detecting the strength of X-rays of the exposure light; exposure apparatus operational unit 304 for calculating the accumulated dose of the mask 105 in accordance with the detection by the X-ray detector 303; a storing device (storing means) 305 for memorizing the accumulated dose of each mask 105; a display means 306 for displaying the accumulated dose of each mask 105; and mask history record controller (control device) 302 for receiving outputs of these components and controlling their operations as well as checking various operations of the exposure apparatus.

The detection of the dose of the mask 105 in this embodiment can be carried out in the manner as disclosed in Japanese Laid-Open Patent Application, Laid-Open No. 3-53199. The operation to be made in the exposure process in accordance with this embodiment will now be explained.

As a mask 105 is placed in the exposure chamber 103, the mask ID 205 of the mask 105 is read by the mask ID reader 301. In response, the mask history record controller 302 recognizes the mask ID 205 and reads out the accumulated dose memorized in the storing means 305 in relation to the mask ID 205. In response to a start of the exposure operation, the dose in each exposure is detected. The X-ray detector 303 detects the strength of the X-rays not passing through the mask 105, prior to the setting of the mask 105, as well as the strength of the X-rays passed through the mask 105, after the setting of the same. The results are outputted to the exposure operational unit 304.

Now, the i-th exposure of the mask 105 will be considered.

If the X-ray strength before passing through the mask 105 is Iie0 and the X-ray strength after passing through the mask 105 is Iie1, then the X-ray strength Ii absorbed in this exposure by the mask 105 is Iie0−Iie1. The exposure apparatus operational unit 304 calculates this X-ray strength Ii and outputs the same to the mask history record controller 302. In response and from the X-ray strength Id and the exposure time Ti of the i-th exposure, the mask history record controller 302 calculates the exposure amount Di ($=$ Ii$\times$Ti) and adds the same to the accumulated dose accomplished up to the (i−1)-th exposure to thereby determine the accumulated dose Z of the mask 105. Subsequently, it signals to the storing device 305 the mask ID 205 and the accumulated dose Z together with an accumulated dose rewriting command. Also, it signals to the display 306 the mask ID 205 and the accumulated dose Z. In response, in the storing device 305, the accumulated dose memorized in relation to the mask ID 205 therein is rewritten into Z. On the other hand, in the display means 306, the mask ID 205 and the accumulated dose Z are displayed.

Referring now to FIG. 4, the writing and reading operation in the storing device 305 will be explained.

As shown in FIG. 4, the storing means 305 comprises a magnetic recording head 401, a magnetic recording medium 402, a reproducing magnetic head 403 and a storing means controller 404 for controlling the writing and reading operation.

In response to the reception of the accumulated dose reading command and the mask ID 205 as outputted from the mask history record controller 302, the storing means controller 404 causes the reproducing magnetic head 403 to read out the accumulated dose having been recorded in the magnetic recording medium 402 in relation to the mask ID 205, and supplies it to the mask history record controller 302. Also, if the mask ID 205 and the accumulated dose Z are inputted together with an accumulated dose rewriting command as outputted from the mask history record controller 302, the accumulated dose having been recorded in the magnetic recording medium 402 in relation to the mask ID 205 is rewritten into Z through the recording magnetic head 401.

Since in the display 306 the accumulated dose Z of the mask 105 is displayed together with the mask ID 205, an operator can easily recognize the timing of replacement of the mask. Such mask replacement may be made automatically in accordance with the accumulated dose.

Figure 5:
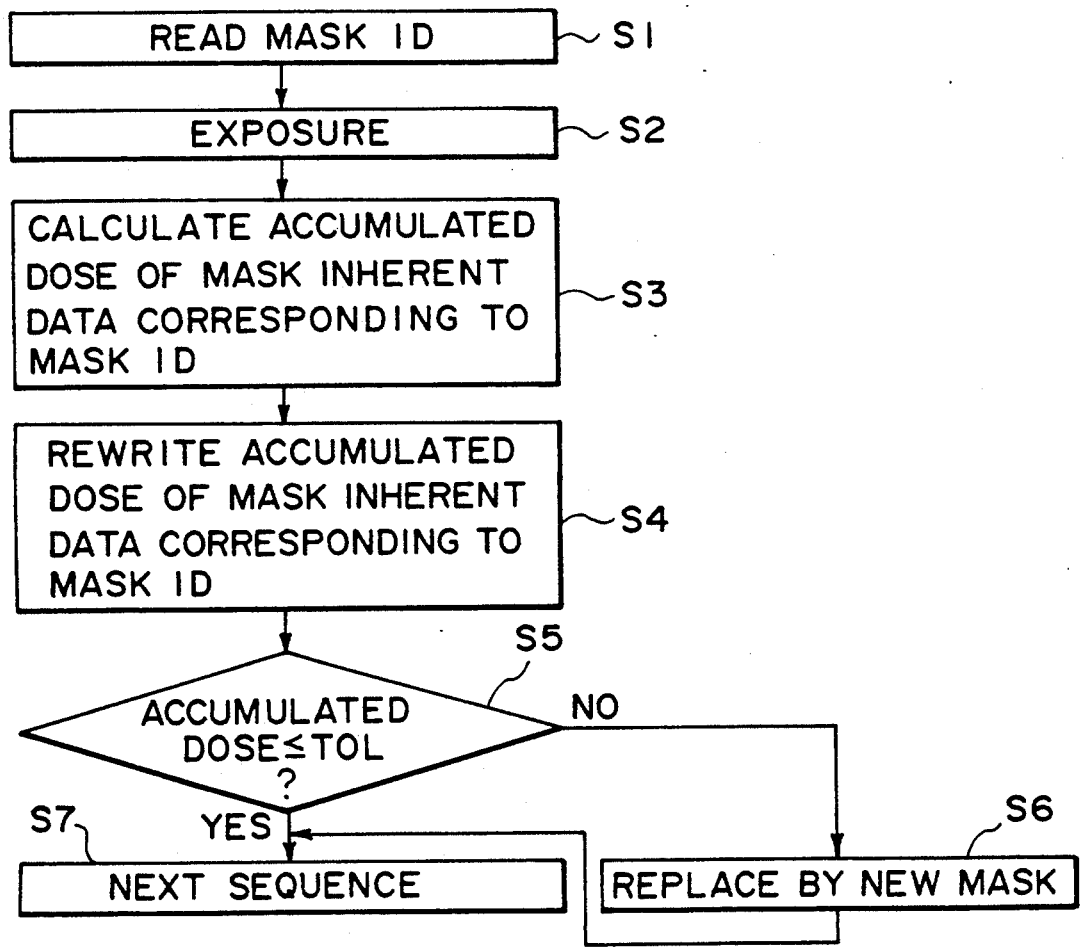
FIG. 5 is a flow chart showing an embodiment wherein the first embodiment is modified so that the mask replacement can be made automatically.

FIG. 5 is a flow chart showing an example wherein the mask replacement can be done automatically.

As a mask 105 is set, its mask ID 205 is read (step S1). After this, the exposure operation is effected (step S2). Then, the accumulated dose Z of the mask 105 is calculated (step S3) and the accumulated dose for the mask ID 205 as memorized in the storing means 305 is rewritten (step S4). Then, discrimination is made by the mask history record controller 302 as to whether the accumulated dose Z is greater than a predetermined allowable dose (step S5). If not, the subsequent sequence operation (exposure, stepwise movement, etc.) is carried out (step S7). If so, on the other hand, a mask changing means (not shown) is actuated to replace the mask 105 by a new one (step S6) and, thereafter, the subsequent sequence operation is effected.

A second embodiment of the present invention will now be explained.

In this embodiment, the X-ray detector 303 shown in the block diagram of FIG. 3 is omitted and only the exposure apparatus operational unit 304, the mask history record controller 302 and the storing means 305 are used. Therefore, explanation will be made by reference to FIGS. 2 and 3, using the same reference numerals.

In the first embodiment, the X-ray quantity absorbed by the mask 105 is calculated on the basis of a change in the X-ray strength detected by the X-ray detector 303. In the present embodiment, as compared therewith, the X-ray quantity is calculated on the basis of the wavelength characteristic $I(\lambda)$ of the X-ray strength of the radiation light 101 as well as the materials of the mask absorbing medium 201 and the mask supporting film 202.

Here, the materials of the mask absorbing medium 201 and the mask supporting film 202 are denoted by k1 and k2, respectively. The thickness of the former is denoted by d1 and that of the latter is denoted by d2. Also, the section along a plane A—A' in FIG. 2 is taken as an x-y plane, and such a function $S(x,y)$ which presents "1" if the mask absorbing material 201 is present on the x-y plane and which presents "0" if no mask absorbing material is present on that plane, is determined. If the wavelength characteristics of X-ray absorptivities of the materials k1 and k2 are $\mu k1(\lambda)$ and $\mu k2(\lambda)$, respectively, and the exposure time is T, then the X-ray strength Ii as absorbed by the mask 105 in the exposure time T can be calculated in accordance with the following equation:

$$Ii = \int_0^T \int_{-\infty}^{\infty} \int_{-\infty}^{\infty} \int_0^{\infty} I(\lambda)$$

$$(1 - e^{-\mu k1(\lambda)S(x,y)d1})(1 - e^{-\mu k2(\lambda)d2}) d\lambda dx dy dt$$

The mask history record controller 302 of this embodiment stores the wavelength characteristic $I(\lambda)$ of the X-ray strength as above into an inside memory thereof, and the storing means 305 records on the magnetic recording medium 402 (FIG. 4) the data of the materials k1 and k2, thicknesses d1 and d2 and the function S(x,y) as well as the wavelength characteristics $\mu k(\lambda)$ of various materials, in the form of a table.

The mask history record controller operates to cause the exposure apparatus operational unit 304 to calculate, on the basis of various data as memorized and the exposure time Ti, the exposure amount Di ($=$Ii$\times$Ti). Additionally, it causes the operational unit to calculate $\epsilon$Di (n is the number of exposures having been made to the mask 205), whereby the accumulated dose Z is obtained. Subsequently, the mask history record controller 302 applies the accumulated dose Z and the mask ID 205 to the storing means 305 and the display 306, to cause the former to rewrite the memorized data and to cause the latter to display information.

As described, the detecting means of this embodiment is constituted by the mask history record controller 302 which also serves as a control means, the storing device 305 which also serves as a storing means, and the exposure apparatus operational unit 304.

Figure 6:
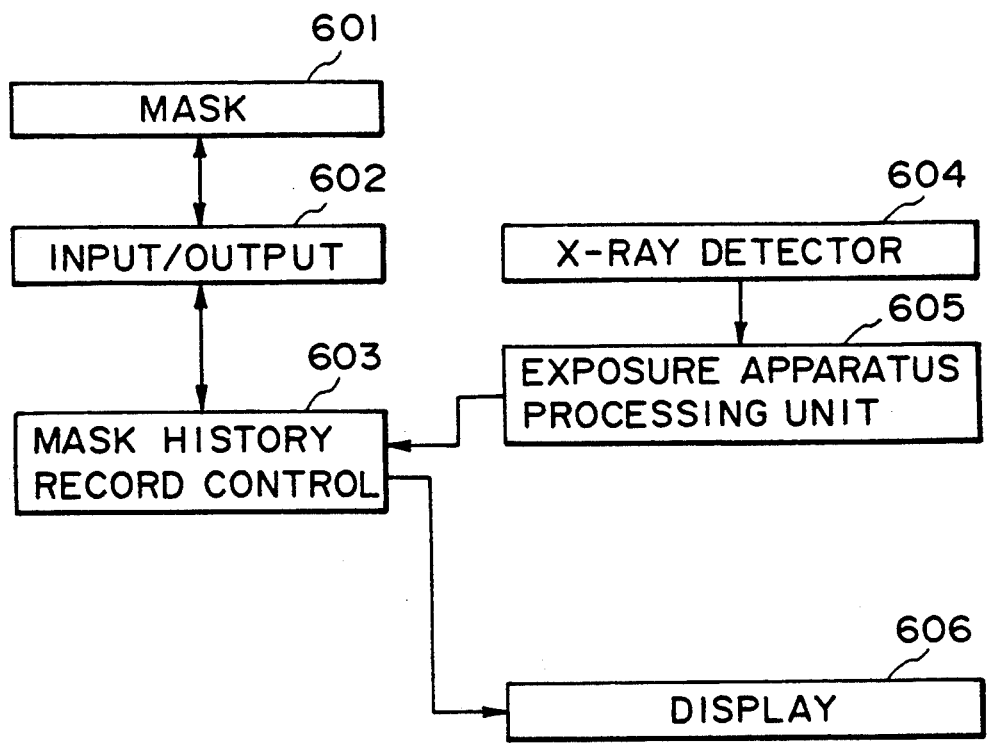
FIG. 6 is a block diagram showing a general structure of a third embodiment of the present invention.

FIG. 6 is a block diagram showing the general structure of a third embodiment of the present invention.

Mask 601 of this embodiment accommodates a static random access memory (SRAM) 702 (FIG. 7) which is used as the storing means 305 of the first embodiment. It is connectable with a mask history record controller 603 through an input/output element 602. The structure and operation of the remaining part of this embodiment, such as an X-ray detector 604, an exposure apparatus operational unit 605 and a display 606, are essentially the same as that of the X-ray detector 303, the exposure apparatus operational unit 304 and the display 306 shown in FIG. 3. Therefore, detailed explanation of them is omitted here.

Figure 7:
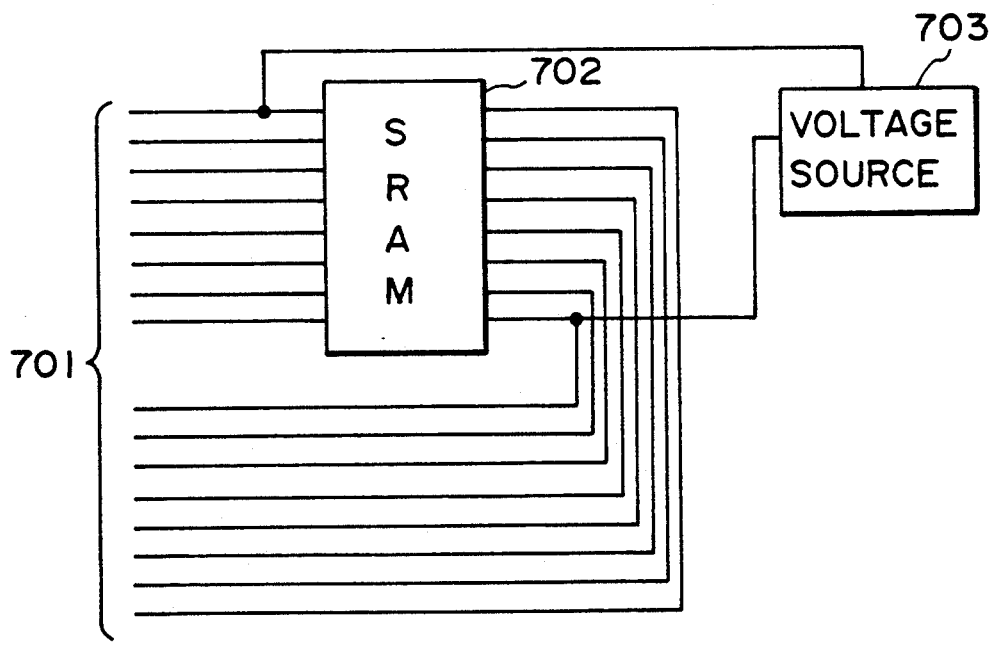
FIG. 7 is a block diagram showing the structure of an electronic circuit as acccmmodated in a mask 601 in FIG. 6.

The SRAM 702 accommodated in the mask 601 is power-supplied from a backup voltage source 703 such as a lithium battery, for example, shown in FIG. 7. It can be connected to the input/output element 602 shown in FIG. 6 through a wiring means 701.

Figure 8:
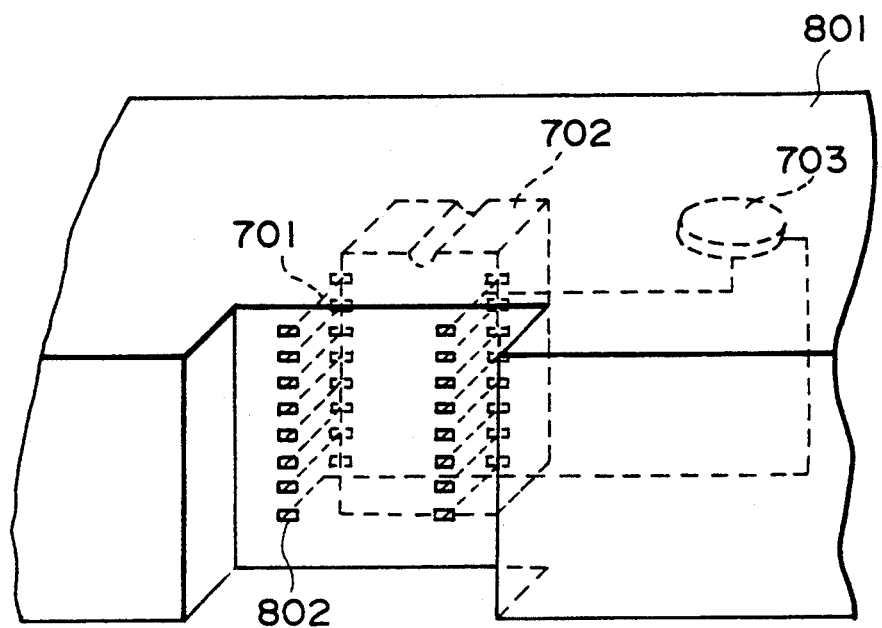
FIGS. 8 and 9 are perspective views, respectively, showing the structures of the mask 601 and an input-/output element 602 in FIG. 6.
Figure 9:
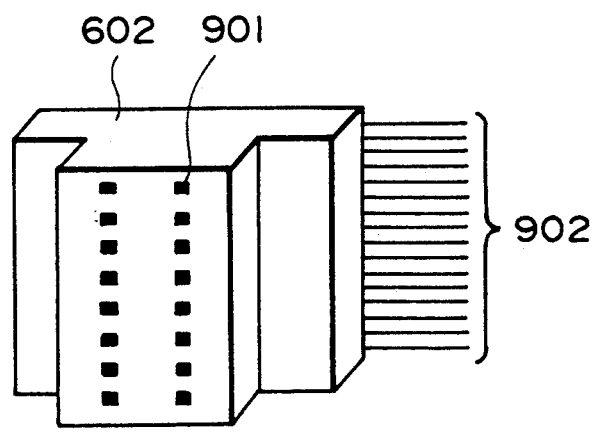

FIG. 8 is a perspective view showing the general structure of the mask 601, and FIG. 9 is a perspective view showing the structure of the input/output element 602.

The SRAM 702 and the voltage source 703 are embedded in a mask reinforcing member 801 which is a constituent element of the mask 601. The reinforcing member 801 has a recess formed in its outer circumferential portion, and a plurality of electrodes 802 to be connected to corresponding terminals of the SRAM 702 through the wiring means 701 are provided on the bottom of the recess.

The input/output element 602 has a convex shape suited to engage with the recess of the mask reinforcing member 801, and it can be coupled to the mask reinforcing member 801 by means of a locking mechanism (not shown).

Electrodes 901 are provided at the top of the input/output element 602 so as to engage with corresponding electrodes 802, respectively. By means of a wiring means 902 connected to these electrodes 901, they can be connected to the mask history record controller 603.

The mask history record controller 603 can be connected to the SRAM 702 through these wirings 701 and 902 as well as the electrodes 802 and 901, for read-out or rewriting of a record memorized in the SRAM 702.

The operation of this embodiment will now be explained.

The SRAM 702 accommodates four 8-bit addresses and has a 1024-bit memory region. The mask history record controller 603 recognizes the quotient "b" obtained by dividing the allowable accumulated dose P by "1024", as the dose corresponding to one bit. As an exposure is effected, it reads out the bit number B recorded in the SRAM 702. Subsequently, by multiplying the read bit number B by the dose b corresponding to one bit, the mask history record controller calculates the accumulated dose having been accomplished up to the preceding exposures. After this, like the first embodiment, the amount of "current exposure" as obtainable from the X-ray detector 604 and the exposure operational unit 605 is added to the accumulated dose, and the sum is compared with the allowable dose P. If the accumulated dose is less than the allowable level P, the quotient obtained by dividing the accumulated dose by the dose b corresponding to one bit is memorized into the SRAM 702, and this is displayed in the display 606. When, after this, the mask 601 is replaced by another, the content of the memory of the SRAM 702 is cleared.

In the present embodiment, as described, a memorizing means is incorporated into a mask 601. Thus, there is no necessity of recording a mask ID or using a reader to read the mask ID. As a result, it is possible to make the structure simple.

In the second embodiment, the accumulated dose is displayed. In the third embodiment, the result of a comparison of the accumulated dose with the allowable level is displayed. However, as with the first embodiment, the device may be used in combination with a mask changing means to allow automatic mask replacement.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus for exposing a mask with a radiation beam, said apparatus comprising:
   display means for displaying an exposure dose of the mask;
   detecting means for detecting the amount of exposure absorbed by the mask during each exposure;
   storing means comprising a semiconductor memory for memorizing an accumulated dose of the mask, said storing means being integrally provided on the mask; and control means for causing said display means to display the exposure does of the mask, wherein the dose to be displayed corresponds to a sum of he accumulated dose memorized in said storing means and the amount of exposure detected by said detecting means.

2. An apparatus according to claim 1, wherein said control means comprises means for comparing the sum of the accumulated dose and the detected exposure amount with an allowable level and means for causing said display means to display the result of the comparison.

3. An apparatus according to claim 2, further comprising mask changing means for effecting mask replacement, wherein, when the sum of the accumulated dose and the detected exposure amount is greater than the allowable level, said control means operates to cause said mask changing means to effect mask replacement.

4. A mask for use in an exposure apparatus, comprising:
   a mask frame;
   a mask pattern supported by said mask frame, said mask pattern being irradiated with a radiation beam when said mask is incorporated into the exposure apparatus; and
   data-rewritable type memory means for storing dose histories of the mask under radiation exposure, said memory means being formed integrally with said mask frame.

5. A semiconductor device manufacturing exposure method, comprising the steps of:
   providing different masks each having a pattern to be transferred to a wafer;
   memorizing dose histories of the masks;
   selecting one of the masks;
   irradiating the selected mask with radiation so that the pattern thereof is transferred to the wafer;
   detecting a dose of the irradiated mask as a result of the irradiation thereof with the radiation; and
   renewing the memorized dose history of the irradiated mask on the basis of said detection of the dose, the dose history representing a change in a characteristic of that mask.

6. A semiconductor device manufacturing exposure method, comprising the steps of:
   irradiating a mask and a wafer with radiation;
   detecting a dose of the mask resulting from the irradiation thereof with the radiation;
   renewing a dose history of the mask on the basis of the detected dose, the dose history representing a change in characteristics of the mask; and
   memorizing the renewed dose history of the mask, wherein said memorizing step comprises memorizing the dose history into a memory which is integrally provided on the mask.

7. An exposure apparatus for use with radiation including X-rays, said apparatus comprising:
   holding means for holding a mask selected from a plurality of different masks each having a pattern to be transferred to a substrate;
   an irradiating system for irradiating the mask held by said holding means with the radiation;
   memory means for memorizing dose histories of the different masks; and
   control means for renewing the dose history of the irradiated mask memorized in said memory means, in accordance with the irradiation thereof with the radiation.

8. An exposure apparatus for use with radiation including X-rays, said apparatus comprising:
   a mask frame for supporting a mask pattern to be transferred to a substrate;
   an irradiating system for irradiating the mask with the radiation;
   memory means for memorizing a history of doses of the mask with the radiation, wherein the dose history represents a change in characteristics of the mask; and
   control means for renewing the dose history memorized in said memory means in accordance with the irradiation of the mask with the radiation, wherein said memory means comprises a semiconductor memory provided on said mask frame.

9. An apparatus according to claim 8, wherein said control means comprises a radiation detector.

10. An exposure apparatus for use with radiation including X-rays, said apparatus comprising:
    a mask frame for supporting a mask pattern to be transferred to a substrate;
    an irradiating system for irradiating the mask with the radiation;
    memory means for memorizing a history of doses of the mask with the radiation, wherein the dose history represents a change in characteristics of the mask; and
    control means for renewing the dose history memorized in said memory means in accordance with the irradiation of the mask with the radiation, further comprising a code detector for detecting a code provided on said mask frame.

11. An apparatus according to claim 10, wherein said control means comprises a radiation detector.

12. An exposure apparatus for use with radiation including X-rays, said apparatus comprising:
    a mask frame for supporting a mask pattern to be transferred to a substrate;
    an irradiating system for irradiating the mask with the radiation;
    memory means for memorizing a history of doses of the mask with the radiation, wherein the dose history represents a change in characteristics of the mask; and
    control means for renewing the dose history memorized in said memory means in accordance with the irradiation of the mask with the radiation, further comprising a display for displaying information related to the dose history.

13. An apparatus according to claim 12, further comprising mask changing means for effecting mask replacement in accordance with the information related to the dose history.

14. A mask usable in an exposure apparatus, comprising:
    a mask frame;
    a mask pattern supported by said mask frame, said mask pattern being irradiated with a radiation beam when said mask is incorporated into the exposure apparatus; and
    memory means for storing exposure information of the mask under radiation exposure, said memory means being formed integrally with said mask frame.

15. A semiconductor device manufactured by an exposure method which comprises the steps of:

providing different masks each having a pattern to be transferred to a wafer;
memorizing dose histories of the masks;
selecting one of the masks;
irradiating the selected mask with radiation so that the pattern thereof is transferred to the wafer;

detecting a dose of the irradiated mask as a result of the irradiation thereof with the radiation; and
renewing the memorized dose history of the irradiated mask on the basis of the said detection of the dose, the dose history representing a change in a characteristic of the mask.

* * * * *